US012796316B2

(12) United States Patent
Liang et al.

(10) Patent No.: US 12,796,316 B2
(45) Date of Patent: Nov. 10, 2026

(54) PEROVSKITE PRECURSOR MATERIAL AND PREPARATION METHOD, PEROVSKITE MATERIAL AND PREPARATION METHOD, PEROVSKITE THIN FILM, PEROVSKITE PRECURSOR SLURRY, PEROVSKITE SOLAR CELL AND PREPARATION METHOD, AND ELECTRIC DEVICE

(71) Applicant: Contemporary Amperex Technology (Hong Kong) Limited, Hong Kong (CN)

(72) Inventors: Weifeng Liang, Ningde (CN); Shuojian Su, Ningde (CN); Bao Tu, Ningde (CN); Bo Luan, Ningde (CN); Yongsheng Guo, Ningde (CN); Guodong Chen, Ningde (CN); Junchao Chen, Ningde (CN)

(73) Assignee: Contemporary Amperex Technology (Hong Kong) Limited, Hong Kong (CN)

( * ) Notice: Subject to any disclaimer, the term of this patent is extended or adjusted under 35 U.S.C. 154(b) by 0 days.

(21) Appl. No.: 19/204,623

(22) Filed: May 12, 2025

(65) Prior Publication Data

US 2025/0275466 A1 Aug. 28, 2025

Related U.S. Application Data

(63) Continuation of application No. PCT/CN2023/079826, filed on Mar. 6, 2023.

(51) Int. Cl.
*H10K 85/50* (2023.01)
*H10F 10/17* (2025.01)
(Continued)

(52) U.S. Cl.
CPC ............. *H10K 85/50* (2023.02); *H10F 10/17* (2025.01); *H10F 77/12* (2025.01); *H10K 30/50* (2023.02)

(58) Field of Classification Search
None
See application file for complete search history.

(56) References Cited

U.S. PATENT DOCUMENTS

| | | | | |
|---|---|---|---|---|
| 2013/0214205 A1* | 8/2013 | Vockic | ................. | C09K 11/665 252/301.4 F |
| 2018/0066383 A1* | 3/2018 | Bakr | ......................... | C30B 7/14 |

(Continued)

FOREIGN PATENT DOCUMENTS

| | | |
|---|---|---|
| CN | 107739047 A | 2/2018 |
| CN | 107902692 A | 4/2018 |

(Continued)

OTHER PUBLICATIONS

J. Wang et al., "Efficient perovskite solar cells by metal ion doping", Energy and Environmental Science 9, p. 2892-2901 (Year: 2016).*

(Continued)

*Primary Examiner* — Ryan S Cannon
(74) *Attorney, Agent, or Firm* — K&L Gates LLP

(57) ABSTRACT

Provided are a perovskite precursor and a preparation method, a perovskite material and a preparation method, a perovskite thin film, a perovskite precursor slurry, a perovskite solar cell and a preparation method, and an electric device. The perovskite precursor includes a precursor substrate and doping ions. The doping ions include at least one of alkali metal ions, alkaline earth metal ions, transition metal ions, group IIIA element ions, acid radical ions, and halogen ions. At least a part of the doping ions are embedded into a crystal lattice of the precursor substrate.

10 Claims, 1 Drawing Sheet

(51) Int. Cl.

| | |
|---|---|
| ***H10F 77/12*** | (2025.01) |
| ***H10K 30/50*** | (2023.01) |

(56) References Cited

U.S. PATENT DOCUMENTS

| | | | | |
|---|---|---|---|---|
| 2018/0248052 | A1* | 8/2018 | Seok | H10F 10/00 |
| 2020/0090876 | A1 | 3/2020 | Zhu et al. | |

FOREIGN PATENT DOCUMENTS

| | | | | |
|---|---|---|---|---|
| CN | 108321300 | A | 7/2018 | |
| CN | 108550641 | A | 9/2018 | |
| CN | 108963032 | A | 12/2018 | |
| CN | 110105246 | A | 8/2019 | |
| CN | 110127755 | A | 8/2019 | |
| CN | 111430552 | A | 7/2020 | |
| CN | 114342085 | A | 4/2022 | |
| CN | 115020591 | A | 9/2022 | |
| JP | 2002045699 | A | 2/2002 | |
| JP | 2019133966 | A | 8/2019 | |
| JP | 2022507895 | A | 1/2022 | |
| JP | 2022537682 | A | 8/2022 | |
| WO | WO-2022192711 | A1 * | 9/2022 | H10K 85/50 |

OTHER PUBLICATIONS

Y. Wu et al., "Liquid metal acetate assisted preparation of high-efficiency and stable inverted perovskite solar cells", Journal of Materials Chemistry A 7, p. 14136-14144 (Year: 2019).*

Y. Han et al., "Controlled n-doping in air-stable CsPbl2Br perovskite solar cells with a record efficiency of 16.79%", Advanced Functional Materials 30, 1909972 (Year: 2020).*

J. Poindexter et al., "High tolerance to iron contamination in lead halide perovskite solar cells", ACS Nano 11, p. 7101-7109 (Year: 2017).*

International Search Report of PCT Application No. PCT/CN2023/079826, mailed Apr. 23, 2023, 6 pages with English translation.

The extended European search report received in the counterpart EP Application No. 23925695.1, mailed Aug. 29, 2025, 8 pages.

Wang Changlei et al: "Synergistic effects of thiocyanate additive and cesium cations on improving the performance and initial illumination stability of efficient perovskite solar cells", Sustainable Energy & Fuels, vol. 2, No. 11, Oct. 24, 2018 (Oct. 24, 2018), pp. 2435-2441, XP055897218, DOI: 10.1039/C8SE00200B.

Zhang Wei et al: "Enhanced optoelectronic quality of perovskite thin films with hypophosphorous acid for planar heterojunction solar cells", Nature Communications, vol. 6, No. 1, Nov. 30, 2015 (Nov. 30, 2015), XP093305314, UK ISSN: 2041-1723, DOI: 10.1038/ncomms10030.

Office Action (with English Machine Translation), mailed May 11, 2026, for corresponding Japanese Patent Application Serial No. 2025-526221.

* cited by examiner

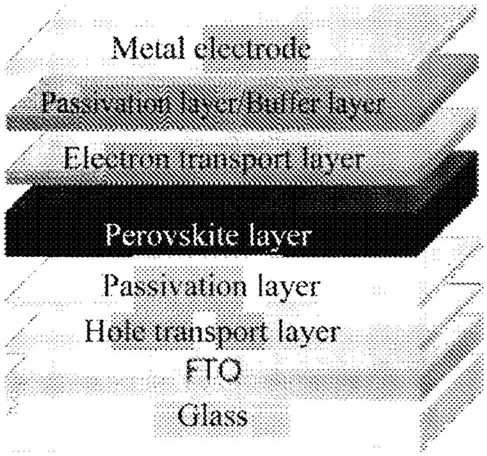
Metal electrode
Passivation layer/Buffer layer
Electron transport layer
Perovskite layer
Passivation layer
Hole transport layer
FTO
Glass

PEROVSKITE PRECURSOR MATERIAL AND PREPARATION METHOD, PEROVSKITE MATERIAL AND PREPARATION METHOD, PEROVSKITE THIN FILM, PEROVSKITE PRECURSOR SLURRY, PEROVSKITE SOLAR CELL AND PREPARATION METHOD, AND ELECTRIC DEVICE

CROSS-REFERENCE TO RELATED APPLICATION

This application is a continuation application of the PCT Application PCT/CN2023/079826 filed on Mar. 6, 2023, which is incorporated herein by reference in the entirety.

TECHNICAL FIELD

The present application relates to the technical field of solar cells, in particular, to a perovskite precursor material and a preparation method, a perovskite material and a preparation method, a perovskite thin film, a perovskite precursor slurry, a perovskite solar cell and a preparation method, and an electric device.

BACKGROUND

Perovskite solar cells are a new type of cells that have been extensively studied currently. In the perovskite solar cell, a perovskite layer has a significant impact on performance of the cell. Improving a material of the perovskite layer is a good entry point for improving performance of the perovskite solar cell.

SUMMARY

According to embodiments of the present application, provided in the present application is a perovskite precursor material, comprising a precursor substrate and doping ions, wherein the doping ions comprise at least one of alkali metal ions, alkaline earth metal ions, transition metal ions, group IIIA element ions, acid radical ions, and halogen ions.

In the foregoing perovskite precursor material, performance of the precursor material can be improved by adding the doping ions. When the perovskite precursor material is prepared into a perovskite material, a grain boundary of a perovskite substrate can be passivated to some extent, thereby improving photoelectric conversion efficiency of a perovskite solar cell.

In some implementations, the mass percentage of the doping ions is 0.0001% to 3% in terms of the percentage thereof in the mass of the perovskite precursor material.

In some implementations, the mass percentage of the doping ions is 0.0001% to 1%.

In some implementations, the alkali metal ions comprise at least one of $Na^+$ and $NL^+$.

In some implementations, the alkaline earth metal ions comprise at least one of $Mg^{2+}$ and $Ca^{2+}$.

In some implementations, the transition metal ions comprise at least one of $Fe^{2+}$, $Fe^{3+}$, and $Cu^{2+}$.

In some implementations, the group IIIA element ions comprise at least one of $B^{3+}$, $Al^{3+}$, $Ga^{3+}$, and $In^{3+}$.

In some implementations, the acid radical ions comprise at least one of $Ac^-$, $PO_2^{3-}$, $CO_3^{2-}$, and $NO_3^-$.

In some implementations, the halogen ions comprise at least one of $F^-$, $Cl^-$, $Br^-$, $I^-$, and $I_3^-$.

In some implementations, the precursor substrate comprises a material having a chemical formula MX, M comprises at least one of organic amine cations, cesium ions, lithium ions, potassium ions, rubidium ions, lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, and X comprises at least one of halogen ions and carboxylate ions.

Further provided in the present application is a preparation method for a perovskite precursor material, comprising the following steps:

- mixing and reacting, in a first solvent, a raw material for providing doping ions and a raw material for synthesizing a precursor substrate, and subjecting a reacted solution to first crystallization treatment, wherein the doping ions comprise at least one of alkali metal ions, alkaline earth metal ions, transition metal ions, group IIIA element ions, acid radical ions, and halogen ions.

In some implementations, the mass percentage of the doping ions is 0.0001% to 3% in terms of the percentage thereof in the mass of the perovskite precursor material.

In some implementations, the mass percentage of the doping ions is 0.0001% to 1%.

In some implementations, the precursor substrate comprises a material having a chemical formula MX, M comprises at least one of organic amine cations, cesium ions, lithium ions, potassium ions, rubidium ions, lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, and X comprises at least one of halogen ions and carboxylate ions.

In some implementations, the precursor substrate comprises a material having a chemical formula MX, M is selected from at least one of organic amine cations and cesium ions, X comprises at least one of halogen ions and carboxylate ions, and the reaction temperature for mixing and reacting, in the first solvent, the raw material for providing the doping ions and the raw material for synthesizing the precursor substrate is 0° C. to 5° C.

In some implementations, the first solvent is selected from at least one of water, methanol, ethanol, propanol, and isopropanol.

In some implementations, the precursor substrate comprises a material having a chemical formula MX, M is selected from at least one of lithium ions, potassium ions, rubidium ions, lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, X comprises at least one of halogen ions and carboxylate ions, and the reaction temperature for mixing and reacting, in the first solvent, the raw material for providing the doping ions and the raw material for synthesizing the precursor substrate is 70° C. to 90° C.

In some implementations, the first solvent is selected from at least one of water, methanol, ethanol, propanol, and isopropanol.

Further provided in the present application is a perovskite precursor slurry, comprising a second solvent and further comprising the foregoing perovskite precursor material or the perovskite precursor material obtained by using the foregoing preparation method for a perovskite precursor material.

Further provided in the present application is a perovskite material, comprising a perovskite substrate and doping ions in the foregoing perovskite precursor material, wherein at least a part of the doping ions are located at a grain boundary of the perovskite substrate, the perovskite substrate comprises at least one of organic amine cations, cesium ions, lithium ions, potassium ions, and rubidium ions, the perovskite substrate further comprises at least one of lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, and the perovskite substrate further comprises at least one of halogen ions and carboxylate ions.

Further provided in the present application is a preparation method for a perovskite material, comprising the following steps:

mixing and reacting, in a third solvent, a raw material comprising the foregoing perovskite precursor material or the perovskite precursor material prepared by using the foregoing preparation method for a perovskite precursor material, and subjecting a reacted solution to second crystallization treatment, wherein the perovskite precursor material comprises at least one of organic amine cations, cesium ions, lithium ions, potassium ions, and rubidium ions, the perovskite precursor material further comprises at least one of lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, and the perovskite precursor material further comprises at least one of halogen ions and carboxylate ions.

Further provided in the present application is a perovskite thin film, comprising the foregoing perovskite material or the perovskite material prepared by using the foregoing preparation method for a perovskite material.

Further provided in the present application is a preparation method for a perovskite thin film, comprising the following step: subjecting the foregoing perovskite precursor slurry to coating and annealing treatment.

Further provided in the present application is a perovskite solar cell, comprising a first electrode, a perovskite layer, and a second electrode that are sequentially stacked, wherein the perovskite layer comprises the foregoing perovskite material, or the perovskite layer comprises the perovskite material obtained by using the foregoing preparation method for a perovskite material, or the perovskite layer comprises the foregoing perovskite thin film, or the perovskite layer is formed by coating and annealing the foregoing perovskite precursor slurry.

Further provided in the present application is a preparation method for a perovskite solar cell, comprising the following steps:

preparing a perovskite layer on a first electrode; and preparing a second electrode on the perovskite layer, wherein the perovskite layer comprises a perovskite material, the perovskite material comprises a perovskite substrate and doping ions, the doping ions comprise at least one of alkali metal ions, alkaline earth metal ions, transition metal ions, group IIIA element ions, acid radical ions, and halogen ions, and at least a part of the doping ions are located at a grain boundary of the perovskite substrate.

Further provided in the present application is an electric device, comprising the foregoing perovskite solar cell or the perovskite solar cell prepared by using the foregoing preparation method for a perovskite solar cell.

BRIEF DESCRIPTION OF THE DRAWINGS

In order to describe the technical solutions of the present application more clearly, the accompanying drawings used in the present application will be briefly described below. It is clear that the accompanying drawings described below show only some implementations of the present application, and a person of ordinary skill in the art may further derive other accompanying drawings from the accompanying drawings without creative efforts.

FIG. 1 is a schematic structural diagram of an example perovskite solar cell.

In order to better describe and illustrate embodiments and/or examples of those inventions disclosed herein, reference may be made to one or a plurality of accompanying drawings. Additional details or examples used to describe the accompanying drawings should not be considered as limiting the scope of any of the disclosed inventions, the currently described embodiments and/or examples, and best modes of these inventions as currently understood.

DETAILED DESCRIPTION

A perovskite solar cell and a preparation method therefor, and an electric device in the present application are described in more detail below with reference to specific embodiments. The present invention may be implemented in many different forms and is not limited to implementations described herein. Instead, these implementations are provided so that content disclosed in the present invention is understood more thoroughly and comprehensively.

Details of one or a plurality of embodiments of the present application are set forth in the accompanying drawings and the description below. Other features, objectives, and advantages of the present application will be apparent from the specification, and the accompanying drawings, and the claims.

Unless otherwise defined, all technical and scientific terms used herein have the same meaning as commonly understood by a person skilled in the art to which the present invention belongs. Terms used in the specification of the present invention herein are merely for the purpose of describing specific embodiments and are not intended to limit the present invention.

A "range" disclosed in the present application is defined in the form of a lower limit and an upper limit. A given range is defined by selecting a lower limit and an upper limit. The selected lower limit and the selected upper limit define boundaries of a particular range. The range defined in this way may be either inclusive or exclusive and may be combined freely, that is, any lower limit may be combined with any upper limit to form a range. For example, if ranges 60-120 and 80-110 are listed for a particular parameter, it is understood that ranges 60-110 and 80-120 are also contemplated. Further, if smallest range values 1 and 2 are listed and largest range values 3, 4 and 5 are listed, the following ranges can be all contemplated: 1-3, 1-4, 1-5, 2-3, 2-4, and 2-5. In the present application, unless otherwise stated, a numerical range "a-b" represents a shorthand representation for any combination of real numbers between a and b, where both a and b are real numbers. For example, a numerical range "0-5" means that all real numbers between "0-5" have been fully listed herein, and "0-5" is merely a shorthand representation for such numerical combinations. In addition, when a parameter is expressed as an integer greater than or equal to 2, it is equivalent to disclosing that the parameter is, for example, an integer of 2, 3, 4, 5, 6, 7, 8, 9, 10, 11, 12, or the like.

Unless otherwise specified, all implementations and optional implementations of the present application may be combined with each other to form new technical solutions.

Unless otherwise specified, all technical features and optional technical features of the present application can be combined with each other to form new technical solutions.

Unless otherwise specified, all steps in the present application may be performed sequentially or randomly, and are preferably performed sequentially. For example, if the method includes steps (a) and (b), it means that the method may include steps (a) and (b) performed sequentially or may include steps (b) and (a) performed sequentially. For example, if the mentioned method may further include step (c), it means that step (c) may be added to the method in any order. For example, the method may include steps (a), (b) and (c), or may comprise steps (a), (c) and (b), or may include steps (c), (a) and (b), or the like.

Unless otherwise specified, the terms "comprise" and "include" mentioned in the present application denote open-ended or may be close-ended. For example, "comprise" and "include" may mean that other components not listed may be further comprised or included, or that only listed components may be comprised or included.

Unless otherwise specified, the term "or" is inclusive in the present application. For example, the phrase "A or B" means "A, B, or both A and B". More specifically, the condition "A or B" is satisfied by any one of the following: A is true or exists and B is false or does not exist, A is false or does not exist and B is true or exists, or both A and B are true, or both A and B exist.

Unless otherwise specified, the term "room temperature" in the present application generally refers to 4° C. to 30° C., and preferably refers to 25±5° C.

Provided in the present application is a perovskite precursor. The perovskite precursor includes a precursor substrate and doping ion. The doping ions include at least one of alkali metal ions, alkaline earth metal ions, transition metal ions, group IIIA element ions, acid radical ions, and halogen ions.

In the perovskite precursor material of the present application, performance of the precursor material can be improved by adding the doping ions. When the perovskite precursor material is prepared into a perovskite material, a grain boundary of a perovskite substrate can be passivated to some extent, thereby improving photoelectric conversion efficiency of a perovskite solar cell.

In some implementations, at least a part of the doping ions are embedded into a crystal lattice of the precursor substrate. In this case, doping uniformity of the doping ions can be improved. When the perovskite precursor material is prepared into a perovskite material, the doping ions may be located at a grain boundary of the perovskite substrate to further passivate the grain boundary, thereby further improving photoelectric conversion efficiency of a perovskite solar cell. It may be understood that in the perovskite precursor material, a part of doping ions may be located on the surface of the precursor substrate.

In some implementations, the mass percentage of the doping ions is 0.0001% to 3% in terms of the percentage thereof in the mass of the perovskite precursor material. Optionally, the mass percentage of the doping ions in terms of the percentage thereof in the mass of the perovskite precursor material is 0.0001%, 0.001%, 0.01%, 0.02%, 0.03%, 0.05%, 0.08%, 0.1%, 0.2%, 0.3%, 0.4%, 0.5%, 0.6%, 0.7%, 0.8%, 0.9%, 1%, 1.2%, 1.5%, 1.8%, 2%, 2.2%, 2.5%, 2.8%, 3%, or the like Further optionally, the mass percentage of the doping ions is 0.0001% to 1%.

In some implementations, when the doping ions are cations, the mass percentage of the doping ions is 0.0001% to 0.5% in terms of the percentage thereof in the mass of the perovskite precursor material. When the doping ions are anions, the mass percentage of the doping ions is 0.0001% to 3% in terms of the percentage thereof in the mass of the perovskite precursor material.

Optionally, the type and the content of the doping ions may be measured in a manner such as inductively coupled plasma (ICP) spectroscopy or ion chromatography (IC). Specifically optionally, the cations are measured by ICP, and the anions are measured by IC. Distribution of the doping ions in the precursor material may be measured by energy dispersive spectrometer (EDS).

In some implementations, the alkali metal ions include at least one of $Na^+$ and $NL^+$. The alkaline earth metal ions include at least one of $Mg^{2+}$ and $Ca^{2+}$. The transition metal ions include at least one of $Fe^{2+}$, $Fe^{3+}$, and $Cu^{2+}$. The group IIIA element ions include at least one of $B^{3+}$, $Al^{3+}$, $Ga^{3+}$, and $In^{3+}$. The acid radical ions include at least one of $Ac^-$, $PO_2^{3-}$, $CO_3^{2-}$, and $NO_3^-$. The halogen ions include at least one of $F^-$, $Cl^-$, $Br^-$, $I^-$, and $I_3^-$.

It may be understood that the perovskite material is typically prepared from a halide precursor and a chemical formula of the prepared perovskite material is $ABX_3$ or $A_2CDX_6$.

A is inorganic, organic, or organic-inorganic hybrid cations, and includes at least one of organic amine cations, Cs cations, K cations, Rb cations, and Li cations. The organic amine cation is selected from $(NR1R2R3R4)^+$, $(R1R2N{=}CR3R4)^+$, $(R1R2N{-}C(R5)\text{-}NR3R4)^+$, or $(R1R2N{-}C(NR5R6){=}R3R4)^+$. R1, R2, R3, R4, R5, and R6 are each independently selected from H, a substituted or unsubstituted C1-20 alkyl group, or a substituted or unsubstituted aryl group. Optionally, A is at least one of methylammonium $(CH_3NH_3^+)(MA^+)$, formammonium $(HC(NH_2)_2^+)(FA^+)$, cesium ions ($Cs^+$), and rubidium ($Rb^+$). Further optionally, A is methylammonium ($CH_3NH_3^+$) or formammonium ($HC(NH_2)_2^+$).

B is inorganic, organic, or organic-inorganic hybrid cations, and includes at least one of lead, tin, zinc, titanium, antimony, bismuth, nickel, iron, cobalt, silver, copper, gallium, germanium, magnesium, calcium, indium, aluminum, manganese, chromium, molybdenum and europium. Optionally, B is at least one of divalent metal ions $Pb^{2+}$ and $Sn^{2+}$.

C is inorganic, organic, or organic-inorganic hybrid cations. Optionally, C is monovalent metal ions Ag+ or the like.

D is inorganic, organic, or organic-inorganic hybrid cations. Optionally, D is trivalent metal ions such as bismuth cations $Bi^{3+}$, antimony cations $Sb^{3+}$, or indium cations $In^{3+}$.

X is inorganic, organic, or organic-inorganic hybrid anions. Optionally, X is one or a plurality of halogen anions or carboxylate anions. Further optionally, X is bromide ions ($Br^-$) or iodide ions ($I^-$).

Corresponding to the chemical formula $ABX_3$ or $A_2CDX_6$ of the perovskite material, the perovskite precursor may be represented as including a material having at least one of chemical formulae AX, BX, CX and DX, where A, B, C, D, X may be correspondingly selected from those listed above.

In some implementations, the precursor substrate includes a material having a chemical formula MX, M includes at least one of organic amine cations, cesium ions, lithium ions, potassium ions, rubidium ions, lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, and X includes at least one of halogen ions and carboxylate ions. It may be understood that when both the doping ions and X contain halogen ions, the halogen ions in the doping ions and the halogen ions in X may be the same or different. Optionally, the organic amine cations are monovalent organic amine cations, the cesium ions are monovalent cesium ions, the lithium ions are monovalent lithium ion, the potassium ions are monovalent potassium ions, the rubidium ions are monovalent rubidium ions, the lead ions are divalent lead ions, the tin ions are divalent tin ions, the zinc ions are divalent zinc ions, the titanium ions are tetravalent titanium ions, the antimony ions are trivalent antimony ions, the bismuth ions are trivalent bismuth ions, the nickel ions are divalent nickel ions, the iron ions are divalent or trivalent iron ions, the cobalt ions are divalent or trivalent cobalt ions, the silver ions are monovalent silver ions, the copper ions are divalent copper ions, the gallium ions are trivalent gallium ions, the germanium ions are divalent or tetravalent germanium ions, the magnesium ions are divalent magnesium ions, the calcium ions are divalent calcium ions, the indium ions are trivalent indium ions, the aluminum ions are trivalent aluminum ions, the manganese ions are divalent, tetravalent, hexavalent, or heptavalent manganese ions, the chromium ions are trivalent chromium ions, the molybdenum ions are trivalent molybdenum ions, and the europium ions are divalent or trivalent europium ions.

Further provided in the present application is a preparation method for a perovskite precursor material. The preparation method for a perovskite precursor material includes the following steps: mixing and reacting, in a first solvent, a raw material for providing doping ions and a raw material for synthesizing a precursor substrate, and subjecting a reacted solution to first crystallization treatment, where the doping ions include at least one of alkali metal ions, alkaline earth metal ions, transition metal ions, group IIIA element ions, acid radical ions, and halogen ions.

In the preparation method for a perovskite precursor material, the raw material for providing the doping ions and the raw material for synthesizing the precursor substrate are mixed and reacted in the first solvent, and then subjected to the first crystallization treatment, so that a perovskite precursor can be prepared in situ. According to the preparation method, the doping ions can be uniformly dispersed, so that aggregation of the doping ions can be effectively avoided, and performance of the perovskite precursor is prevented from being restricted by aggregation of the doping ions. Therefore, performance of the perovskite precursor material can be improved, and performance of a perovskite material and a perovskite solar cell can be improved.

In addition, the raw material for providing the doping ions and the raw material for synthesizing the precursor substrate are mixed and reacted in the first solvent, so that introduction of the doping ions facilitates crystallization of the perovskite precursor material, resulting in a perovskite precursor material having a more stable structure.

Furthermore, according to the preparation method, the doping ions can be embedded into a crystal lattice of the precursor substrate, to further improve distribution uniformity of the doping ions.

Optionally, when the raw material for providing the doping ions and the raw material for synthesizing the precursor substrate are mixed and reacted in the first solvent, the raw material for providing the doping ions and the raw material for synthesizing the precursor substrate are simultaneously added into the first solvent before being mixed and reacted.

In some implementations, the mass percentage of the doping ions is 0.0001% to 3% in terms of the percentage thereof in the mass of the perovskite precursor material. Optionally, the mass percentage of the doping ions is 0.0001% to 1%. It may be understood that the mass percentage of the doping ions in terms of the percentage thereof in the mass of the perovskite precursor material may be correspondingly selected from the mass percentages listed above in the context of the perovskite precursor material. Details are not described herein again.

In some implementations, the precursor substrate includes a material having a chemical formula MX, M includes at least one of organic amine cations, cesium ions, lithium ions, potassium ions, rubidium ions, lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, and X includes at least one of halogen ions and carboxylate ions.

In some implementations, the precursor substrate includes a material having a chemical formula MX, M is selected from at least one of organic amine cations and cesium ions, X includes at least one of halogen ions and carboxylate ions, and the reaction temperature for mixing and reacting, in the first solvent, the raw material for providing the doping ions and the raw material for synthesizing the precursor substrate is 0° C. to 5° C. Optionally, the reaction temperature may be but is not limited to 0° C., 1° C., 2° C., 3° C., 4° C., 5° C., or the like. Optionally, the first solvent is selected from at least one of water, methanol, ethanol, propanol, and isopropanol.

In some implementations, the precursor substrate includes a material having a chemical formula MX, M is selected from at least one of organic amine cations and cesium ions, X includes at least one of halogen ions and carboxylate ions, and a product obtained from the first crystallization is dried at the temperature of 40° C. to 100° C. Optionally, when the product obtained from the first crystallization is dried, the drying temperature is 40° C., 50° C., 60° C., 70° C., 80° C., 90° C., 100° C., or the like. Optionally, drying is carried out in an oven.

In some other implementations, the precursor substrate includes a material having a chemical formula MX, M is selected from at least one of lithium ions, potassium ions, rubidium ions, lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, X includes at least one of halogen ions and carboxylate ions, and the temperature for mixing and reacting, in the first solvent, the raw material for providing the doping ions and the raw material for synthesizing the precursor substrate is 70° C. to 90° C. Optionally, the reaction temperature may be but is not limited to 70° C., 72°

C., 74° C., 75° C., 78° C., 80° C., 82° C., 84° C., 85° C., 88° C., 90° C., or the like. Optionally, the first solvent is selected from at least one of water, methanol, ethanol, propanol, and isopropanol.

Further provided in the present application is a perovskite precursor slurry. The perovskite precursor slurry includes a second solvent and further includes the foregoing perovskite precursor material or the perovskite precursor material obtained by using the foregoing preparation method for a perovskite precursor material. Optionally, the second solvent includes at least one of N,N-dimethylformamide (DMF) and N-methyl-2-pyrrolidone (NMP).

It may be understood that during preparation of a perovskite solar cell, a perovskite layer may be formed by coating and annealing the perovskite precursor slurry.

Further provided in the present application is a perovskite material. The perovskite material includes a perovskite substrate and doping ions in the foregoing perovskite precursor material. The doping ions include at least one of alkali metal ions, alkaline earth metal ions, transition metal ions, group IIIA element ions, acid radical ions, and halogen ions, and at least a part of the doping ions are located at a grain boundary of the perovskite substrate. The perovskite substrate includes at least one of organic amine cations, cesium ions, lithium ions, potassium ions, and rubidium ions, the perovskite substrate further includes at least one of lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, and the perovskite substrate further includes at least one of halogen ions and carboxylate ions. In the perovskite material, the doping ions may act to passivate the grain boundary, thereby allowing a perovskite solar cell to have higher photoelectric conversion efficiency.

In some implementations, in the perovskite material, at least a part of the doping ions are located on the surface of the perovskite substrate. In this case, the doping ions can repair surface defects of the perovskite material, to further improve photoelectric conversion efficiency of the perovskite solar cell.

Optionally, in the perovskite material, the alkali metal ions include at least one of $Na^+$ and $K^+$, the alkaline earth metal ions include at least one of $Fe^{2+}$, $Fe^{3+}$, and $Cu^{2+}$, the group IIIA element ions include at least one of $B^{3+}$, $Al^{3+}$, $Ga^{3+}$, and $In^{3+}$, the acid radical ions include at least one of $Ac^-$, $PO_2^{3-}$, $CO_3^{2-}$, and $NO_3^-$, and the halogen ions include at least one of $F^-$, $Cl^-$, $Br^-$, $I^-$, and $I_3^-$.

It may be understood that a chemical formula of the perovskite substrate is $ABX_3$ or $A_2CDX_6$.

A is inorganic, organic, or organic-inorganic hybrid cations, and includes at least one of organic amine cations, Cs cations, K cations, Rb cations, and Li cations. The organic amine cation is selected from $(NR1R2R3R4)^+$, $(R1R2N{=}CR3R4)^+$, $(R1R2N{-}C(R5){=}NR3R4)^+$, or $(R1R2N{-}C(NR5R6){=}R3R4)^+$. R1, R2, R3, R4, R5, and R6 are each independently selected from H, a substituted or unsubstituted C1-20 alkyl group, or a substituted or unsubstituted aryl group. Optionally, A is at least one of methylammonium $(CH_3NH_3^+)(MA^+)$, formammonium $(HC(NH_2)_2^+)(FA^+)$, cesium ions $(Cs^+)$, and rubidium $(Rb^+)$. Further optionally, A is methylammonium $(CH_3NH_3^+)$ or formammonium $(HC(NH_2)_2^+)$.

B is inorganic, organic, or organic-inorganic hybrid cations, and includes at least one of lead, tin, zinc, titanium, antimony, bismuth, nickel, iron, cobalt, silver, copper, gallium, germanium, magnesium, calcium, indium, aluminum, manganese, chromium, molybdenum and europium. Optionally, B is at least one of divalent metal ions $Pb^{2+}$ and $Sn^{2+}$.

C is inorganic, organic, or organic-inorganic hybrid cations. Optionally, C is monovalent metal ions Ag+ or the like.

D is inorganic, organic, or organic-inorganic hybrid cations. Optionally, D is trivalent metal ions such as bismuth cations $Bi^{3+}$, antimony cations $Sb^{3+}$, or indium cations $In^{3+}$.

X is inorganic, organic, or organic-inorganic hybrid anions. Optionally, X is one or a plurality of halogen anions or carboxylate anions. Further optionally, X is bromide ions $(Br^-)$ or iodide ions $(I^-)$.

Further provided in the present application is a preparation method for a perovskite material. The preparation method for a perovskite material includes the following steps: mixing and reacting, in a third solvent, a raw material including the foregoing perovskite precursor or the perovskite precursor prepared by using the foregoing preparation method for a perovskite precursor; and subjecting a reacted solution to second crystallization treatment. The perovskite precursor material includes at least one of organic amine cations, cesium ions, lithium ions, potassium ions, and rubidium ions. The perovskite precursor further includes at least one of lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions. The perovskite precursor further includes at least one of halogen ions and carboxylate ions.

In the preparation method for a perovskite material, the raw material including the foregoing perovskite precursor or the perovskite precursor prepared by using the foregoing preparation method for a perovskite precursor is mixed and reacted in the third solvent, and then subjected to the second crystallization treatment, so that the perovskite material can be prepared in situ, and the doping ions can be introduced into a grain boundary of the perovskite substrate. In addition, according to the preparation method, the doping ions can be uniformly dispersed, so that aggregation of the doping ions can be effectively avoided, and performance of the perovskite material is prevented from being restricted by aggregation of the doping ions. Therefore, performance of a perovskite solar cell can be improved. In addition, the raw material including the foregoing perovskite precursor or the perovskite precursor prepared by using the foregoing preparation method for a perovskite precursor is mixed and reacted in the third solvent, so that introduction of the doping ions facilitates crystallization of the perovskite material, resulting in a perovskite material having a more stable structure.

In the preparation method for a perovskite material, a perovskite material having a chemical formula $ABX_3$ or $A_2CDX_6$ is obtained by selecting the perovskite precursor material.

Optionally, when the raw material including the foregoing perovskite precursor material or the perovskite precursor material prepared by using the foregoing preparation method for a perovskite precursor material is mixed and reacted in the third solvent, the raw material including the foregoing perovskite precursor material or the perovskite precursor material prepared by using the foregoing preparation method for a perovskite precursor material is simultaneously added into the third solvent before being mixed and reacted.

Optionally, the third solvent includes at least one of N,N-dimethylformamide (DMF) and N-methyl-2-pyrrolidone (NMP).

Optionally, in the present application, crystallization may be carried out in a manner such as anti-solvent crystallization or cooling crystallization. Optionally, the first crystallization treatment may be carried out in a manner such as anti-solvent crystallization or cooling crystallization. Optionally, the second crystallization treatment may be carried out in a manner such as anti-solvent crystallization or cooling crystallization.

Further provided in the present application is a perovskite thin film. The perovskite thin film includes the foregoing perovskite material or the perovskite material prepared by using the foregoing preparation method for a perovskite material.

Further provided in the present application is a preparation method for a perovskite thin film. The preparation method for a perovskite thin film includes the following step: subjecting the foregoing perovskite precursor slurry to coating and annealing treatment.

Further provided in the present application is a perovskite solar cell. The perovskite solar cell includes a first electrode, a perovskite layer, and a second electrode that are sequentially stacked. The perovskite layer includes the foregoing perovskite material, or the perovskite layer includes the perovskite material obtained by using the foregoing preparation method for a perovskite material, or the perovskite layer includes the foregoing perovskite thin film, or the perovskite layer is formed by applying and annealing the foregoing perovskite precursor slurry.

In some of these implementations, the perovskite solar cell further includes an electron transport layer, and the electron transport layer is located between the perovskite layer and the second electrode. Optionally, a material of the electron transport layer includes fullerene and derivatives thereof.

Optionally, the first electrode is transparent conductive glass or a metal electrode. The second electrode is transparent conductive glass or a metal electrode. Further optionally, the first electrode and the second electrode are different.

In some implementations, the first electrode is typically transparent conductive glass. Optionally, the first electrode is selected from at least one of fluorine-doped tin oxide (FTO), indium tin oxide (ITO), aluminum-doped zinc oxide (AZO), boron-doped zinc oxide (BZO), indium zinc oxide (IZO), and indium tungsten oxide (IWO). Optionally, the thickness of the first electrode layer is 100 nm to 1000 nm, and is optionally 300 nm to 800 nm.

In some implementations, the second electrode is typically a metal electrode. Optionally, the second electrode is selected from at least one of Au, Ag, Cu, Al, Ni, Cr, Bi, Pt, Mg, Mo, W, and alloys thereof. Optionally, the thickness of the second electrode is 20 nm to 200 nm, is optionally 60 nm to 100 nm, and is further optionally 70 nm to 90 nm. It may be understood that the perovskite layer is a light absorbing layer composed of the perovskite material.

In some implementations, the bandgap of the perovskite layer is 1.20 cV to 2.30 cV.

In some implementations, the thickness of the perovskite layer is 200 nm to 800 nm, and is optionally 400 nm to 600 nm. Further optionally, the thickness of the perovskite layer is 200 nm, 300 nm, 400 nm, 500 nm, 600 nm, 700 nm, 800 nm, or the like.

In some implementations, the perovskite solar cell further includes a hole transport layer, and the hole transport layer is located between the first electrode and the perovskite layer. Optionally, the hole transport layer may be at least one of the following materials, derivatives thereof, or materials obtained through doping or passivation: poly[bis(4-phenyl)(2,4,6-trimethylphenyl)amine] (PTAA), poly-3-hexylthiophene (P3HT), tris(biphenyl)amine (H101), 3,4-ethylenedioxythiophene-methoxytriphenylamine (EDOT-SBF), N-(4-phenylaniline) carbazole-spirobifluorene (CzPAF-SBF), poly(3,4-ethylenedioxythiophene):poly(styrenesulfonate) (PEDOT:PSS), polythiophene, nickel oxide ($NiO_x$), molybdenum oxide ($MoO_3$), cuprous iodide (CuI), cuprous oxide (CuO), and the like.

In some implementations, the perovskite solar cell further includes a first passivation layer, and the first passivation layer is located between the perovskite layer and the hole transport layer. Optionally, a material of the first passivation layer includes at least one of poly[bis(4-phenyl)(2,4,6-trimethylphenyl)amine] and Me-4PACz (CAS number: 2747959-96-0).

In some implementations, the perovskite solar cell further includes a second passivation layer and/or a buffer layer, and the second passivation layer and/or the buffer layer are/is located between the electron transport layer and the second electrode. Optionally, materials of the second passivation layer and the buffer layer are bathocuproine (BCP).

It may be understood that the perovskite solar cell includes a conventional perovskite solar cell and an inverted perovskite solar cell. For the conventional perovskite solar cell, the conventional perovskite solar cell includes a first electrode, and an electron transport layer, a perovskite layer, a hole transport layer, and a second electrode that are sequentially stacked on the first electrode. For the inverted perovskite solar cell, the inverted perovskite solar cell includes a first electrode, and a hole transport layer, a perovskite layer, an electron transport layer, and a second electrode that are sequentially stacked on an anode. In the present application, the corresponding conventional perovskite solar cell and inverted perovskite solar cell can be obtained by selecting the materials of the first electrode and the second electrode.

FIG. 1 shows a structure of a perovskite solar cell according to an embodiment of the present application. A first electrode is FTO, and a hole transport layer, a passivation layer, a perovskite layer, an electron transport layer, a passivation layer or a buffer layer, and a metal electrode are sequentially stacked on the first electrode. A glass substrate is provided on a surface that is of the FTO and that is away from the perovskite layer.

Further provided in the present application is a preparation method for a perovskite solar cell. The preparation method for a perovskite solar cell includes the following steps: preparing a perovskite layer on a first electrode; and preparing a second electrode on the perovskite layer. The perovskite layer includes a perovskite material. The perovskite material includes a perovskite substrate and doping ions. The doping ions include at least one of alkali metal ions, alkaline earth metal ions, transition metal ions, group IIIA element ions, acid radical ions, and halogen ions, and at least a part of the doping ions are located at a grain boundary of the perovskite substrate.

Optionally, the perovskite layer may be prepared through spin coating and annealing. Optionally, the electron transport layer may be prepared through spin coating and annealing. Optionally, the second electrode is prepared through evaporation.

Further provided in the present application is an electric device. The electric device includes the foregoing perovskite solar cell. Optionally, the electric device is, for example, an electric device in a communication field, a transportation field, an industrial and agricultural field, a lighting field, or the like. The electric device may include, for example, a satellite, communication equipment, a traffic light, a lighthouse, a wireless telephone booth, monitoring equipment in an oil drilling field, a power system, a camping light, an electric vehicle, an electronic equipment charger, or the like.

EMBODIMENTS

Embodiments of the present application are described below. The embodiments described below are only exemplary, are only intended to explain the present application, and are not to be construed as limiting the present application. In the embodiments, if specific technologies or conditions are not mentioned, technologies or conditions described in the literature in the art or specifications of the product are followed. Reagents or instruments are all conventional products that are commercially available without reference to manufacturers.

A method for testing photoelectric conversion efficiency of a perovskite solar cell in Embodiments and Comparative Embodiments is as follows: The photoelectric conversion efficiency of the perovskite solar cell is tested under irradiation of standard simulated sunlight (AM 1.5G, 100 $mW/cm^2$).

Embodiment 1

(1) Preparation Method for a Perovskite Precursor in this Embodiment at 0° C. to 5° C., adding formamidine acetate into 20 mL of absolute ethanol and stirring the mixture for 0.5 h, then adding hypophosphorous acid and hydroiodic acid for mixing and reacting for 2 h, removing the solvent through rotary evaporation after the reaction is completed, then adding absolute ethanol to dissolve the product, dripping the solution obtained through dissolution into diethyl ether to precipitate out doped formamidinium iodide (FAI), and drying the product in an oven at 60° C. In the perovskite precursor obtained in this embodiment, the precursor substrate is formamidinium iodide, and the doping ions are $PO_2^{2-}$.

(2) Preparation Method for a Perovskite Slurry in this Embodiment weighing 450 mg of lead iodide, 120 mg of formamidinium iodide (FAI) obtained in (1), 15 mg of chloromethylamine, 8 mg of iodomethylamine, and 6 mg of cesium iodide and dissolving the substances in a mixed solution of 0.8 mL of DMF and 0.2 mL of DMSO, stirring the mixture for 3 h, and filtering the mixture with a 0.22 μm organic filter membrane to obtain the perovskite slurry.

(3) Preparation Method for a Perovskite Solar Cell in this Embodiment

S101: taking a set of FTO conductive glass with a specification of 2 cm*2 cm; using a laser marker to etch off 0.5 cm areas on two opposite sides; cleaning the glass with a cleaning agent and then sonicating the glass in deionized water, ethanol, and acetone for 10 min; and after the sonication, blowing and drying the glass with $N_2$ for later use.

S102: taking a sheet of FTO conductive glass, and preparing a nickel oxide layer by using a magnetron sputtering method.

S103: dissolving poly[bis(4-phenyl)(2,4,6-trimethylphenyl)amine] (PTAA) in chlorobenzene at a concentration of 1 mg/mL, stirring and filtering the mixture with a 0.45 μm filter membrane, taking 50 μL of the solution and adding the solution onto the nickel oxide layer, performing spin-coating at a speed of 4000 rpm, and performing annealing treatment on a hot plate at 100° C. for 10 minutes to obtain a passivation layer.

S104: coating the passivation layer with the perovskite slurry obtained in (2) by using a coating method, performing spin-coating at a speed of 3000 rpm, performing annealing at 120° C. for 30 min, and cooling to the room temperature to form a perovskite layer with a thickness of 500 nm.

S105: placing the glass obtained in S104 in evaporation equipment, and sequentially evaporating same 25 nm of C60, 5 nm of BCP, and 100 nm of Cu to obtain a perovskite solar cell.

Embodiment 2

Compared with Embodiment 1, this embodiment differs in that formamidine acetate is replaced with methylamine in the preparation method for a perovskite precursor. In the perovskite precursor obtained in this embodiment, the precursor substrate is iodomethylamine, and the doping ions are $PO_2^{2-}$.

Embodiment 3

Preparation Method for a Perovskite Precursor in this Embodiment at 0° C. to 5° C., adding cesium carbonate and calcium carbonate into 20 mL of water, stirring the mixture for 10 min, adding hydrochloric acid for mixing and reacting for 2 h, removing the solvent through rotary evaporation after the reaction is completed, then adding absolute ethanol to dissolve the product, dripping the solution obtained through dissolution into diethyl ether to precipitate out doped cesium chloride, and drying the product in an oven at 60° C. In the perovskite precursor obtained in this embodiment, the precursor substrate is cesium chloride, and the doping ions are $Ca^{2+}$.

Embodiment 4

Compare with Embodiment 3, this embodiment differs in that calcium carbonate is replaced with iron hydroxide in the preparation method for a perovskite precursor. In the perovskite precursor obtained in this embodiment, the precursor substrate is cesium chloride, and the doping ions are $Fe^{3+}$.

Embodiment 5

Compare with Embodiment 1, this embodiment differs in that formamidine acetate is replaced with methylamine and hydroiodic acid is replaced with hydrochloric acid in the preparation method for a perovskite precursor. In the perovskite precursor obtained in this embodiment, the precursor substrate is chloromethylamine, and the doping ions are $PO_2^{2-}$.

Embodiments 6 to 13

Compared with Embodiment 1, Embodiments 6 to 13 differ in that the doping content of the doping ions is different.

Embodiments 14 to 20

Compared with Embodiment 3, Embodiments 14 to 20 differ in that the doping content of the doping ions is different.

Comparative Embodiment 1

Compared with Embodiment 1, this comparative embodiment differs in that hypophosphorous acid is not added in the preparation method for a perovskite precursor.

Comparative Embodiment 2

Compared with Embodiment 1, this comparative embodiment differs in that mixing and reacting are carried out at 25° C.

Comparative Embodiment 3

Compared with Embodiment 1, this comparative embodiment differs in that the drying temperature is 120° C.

The precursor substrate, the doping ions, the content of the doping ions, and photoelectric conversion efficiency of the perovskite solar cell in Embodiments 1 to 21 and Comparative Embodiments 1 to 3 are shown in Table 1.

TABLE 1

| | Precursor substrate | Doping ions | Doping content/ wt % | Cell photo-electric conversion efficiency/ % |
|---|---|---|---|---|
| Embodiment 1 | Formamidinium iodide | $PO_2^{2-}$ | 0.01 | 18.62% |
| Embodiment 2 | Iodomethylamine | $PO_2^{2-}$ | 0.01 | 18.58% |
| Embodiment 3 | Cesium chloride | $Ca^{2+}$ | 0.01 | 18.49% |
| Embodiment 4 | Cesium iodide | $Fe^{3+}$ | 0.01 | 18.45% |
| Embodiment 5 | Chloromethylamine | $PO_2^{2-}$ | 0.01 | 18.60% |
| Embodiment 6 | Formamidinium iodide | $PO_2^{2-}$ | 0.0001 | 18.12% |
| Embodiment 7 | Formamidinium iodide | $PO_2^{2-}$ | 0.001 | 18.55% |
| Embodiment 8 | Formamidinium iodide | $PO_2^{2-}$ | 0.1 | 18.92% |
| Embodiment 9 | Formamidinium iodide | $PO_2^{2-}$ | 0.5 | 19.02% |
| Embodiment 10 | Formamidinium iodide | $PO_2^{2-}$ | 1 | 18.78% |
| Embodiment 11 | Formamidinium iodide | $PO_2^{2-}$ | 2 | 18.62% |
| Embodiment 12 | Formamidinium iodide | $PO_2^{2-}$ | 3 | 18.58% |
| Embodiment 13 | Formamidinium iodide | $PO_2^{2-}$ | 4 | 18.44% |
| Embodiment 14 | Cesium chloride | $Ca^{2+}$ | 0.0001 | 18.23% |
| Embodiment 15 | Cesium chloride | $Ca^{2+}$ | 0.001 | 18.32% |
| Embodiment 16 | Cesium chloride | $Ca^{2+}$ | 0.1 | 18.67% |
| Embodiment 17 | Cesium chloride | $Ca^{2+}$ | 0.5 | 18.89% |
| Embodiment 18 | Cesium chloride | $Ca^{2+}$ | 1 | 18.90% |
| Embodiment 19 | Cesium chloride | $Ca^{2+}$ | 2 | 18.72% |
| Embodiment 20 | Cesium chloride | $Ca^{2+}$ | 3 | 18.55% |
| Embodiment 21 | Cesium chloride | $Ca^{2+}$ | 4 | 18.11% |
| Comparative Embodiment 1 | Formamidinium iodide | / | 0 | 16.89% |
| Comparative Embodiment 2 | Formamidinium iodide | $PO_2^{2-}$ | 0.01 | 17.25% |
| Comparative Embodiment 3 | Formamidinium iodide | $PO_2^{2-}$ | 0.01 | 17.16% |

In Table 1. the doping content represents the mass percentage of the doping ions to the mass of the perovskite precursor material.

Embodiment 22

(1) Preparation Method for a Perovskite Precursor in this Embodiment at 80° C., adding KI, lead acetate, $FeI_2$ (a raw material containing doping ions) into deionized water for mixing and reacting, and crystallizing the product through cooling after mixing and reacting. In the obtained perovskite precursor, the precursor substrate material is $PbI_2$, and the doping ions are $Fe^{2+}$.

(2) Preparation Method for a Perovskite Slurry in this Embodiment dissolving 4.61 g of the perovskite precursor obtained in (1), 2.6 g of CsI, and 1.72 g of FAI in a DMF/NMP (4/1, v/v) solvent for mixing to obtain a perovskite slurry.

(3) Preparation Method for a Perovskite Solar Cell in this Embodiment

S101: taking a set of FTO conductive glass with a specification of 2 cm*2 cm; using a laser marker to etch off 0.5 cm areas on two opposite sides; cleaning the glass with a cleaning agent and then sonicating the glass in deionized water, ethanol, and acetone for 10 min; and after the sonication, blowing and drying the glass with $N_2$ for later use.

S102: taking a sheet of FTO conductive glass, and preparing a nickel oxide layer by using a magnetron sputtering method.

S103: dissolving poly[bis(4-phenyl)(2,4,6-trimethylphenyl)amine] (PTAA) in chlorobenzene at a concentration of 1 mg/mL, stirring and filtering the mixture with a 0.45 μm filter membrane, taking 50 μL of the solution and adding the solution onto the nickel oxide layer, performing spin-coating at a speed of 4000 rpm, and performing annealing treatment on a hot plate at 100° C. for 10 minutes to obtain a passivation layer.

S104: coating the passivation layer with the perovskite slurry obtained in (2) by using a coating method, performing spin-coating at a speed of 3000 rpm, performing annealing at 120° C. for 30 min, and cooling to the room temperature to form a perovskite layer with a thickness of 500 nm.

S105: placing the glass obtained in S104 in evaporation equipment, and sequentially evaporating same 25 nm of C60, 5 nm of BCP, and 100 nm of Cu to obtain a perovskite solar cell.

Embodiment 23 to Embodiment 33

Compared with Embodiment 22, Embodiments 23 to 33 differ in that the precursor substrate, the doping ions, and the doping content are different. Specific differences are shown in Table 2.

Comparative Embodiment 4

Compared with Embodiment 22, this comparative embodiment differs in that in the preparation method for a perovskite slurry, $PbI_2$ is undoped $PbI_2$, and $FeI_2$ is added into the mixed solution.

Comparative Embodiment 5

Compared with Embodiment 22, this comparative embodiment differs in that $FeI_2$ is not added.

Comparative Embodiment 6

Compared with Embodiment 22, this Comparative Embodiment differs in that in the preparation method for a perovskite slurry, $PbBr_2$ is undoped $PbBr_2$, and $FeI_2$ is added into the mixed solution.

The precursor substrate, the doping ions, the content of the doping ions, and photoelectric conversion efficiency of the perovskite solar cell in Embodiments 22 to 33 and Comparative Embodiments 4 to 6 are shown in Table 2.

TABLE 2

| Embodiments | Precursor substrate | Doping ions | Doping content/ wt % | Cell photo-electric conversion efficiency/ % |
|---|---|---|---|---|
| Embodiment 22 | $PbI_2$ | $Fe^{2+}$ | 0.0001 | 16.52 |
| Embodiment 23 | $PbI_2$ | $Fe^{2+}$ | 0.001 | 17.18 |
| Embodiment 24 | $PbI_2$ | $Fe^{2+}$ | 0.01 | 18.92 |
| Embodiment 25 | $PbI_2$ | $Fe^{2+}$ | 0.1 | 18.53 |
| Embodiment 26 | $PbI_2$ | $Fe^{2+}$ | 0.5 | 18.01 |
| Embodiment 27 | $PbI_2$ | $K^+$ | 0.001 | 17.72 |
| Embodiment 28 | $PbI_2$ | $Ca^{2+}$ | 0.001 | 17.71 |
| Embodiment 29 | $PbI_2$ | $Mg^{2+}$ | 0.001 | 17.81 |
| Embodiment 30 | $PbI_2$ | $NO^{3-}$ | 0.001 | 17.22 |
| Embodiment 31 | $PbI_2$ | $F^-$ | 0.001 | 17.57 |
| Embodiment 32 | $PbBr_2$ | $Fe^{2+}$ | 0.001 | 17.29 |
| Embodiment 33 | $PbI_2$ | $Fe^{2+}$ | 1 | 16.12 |
| Comparative Embodiment 4 | $PbI_2$ | / | / | 15.01 |
| Comparative Embodiment 5 | $PbI_2$ | / | / | 14.32 |
| Comparative Embodiment 6 | $PbBr_2$ | / | / | 14.29 |

In Table 2, the doping content represents the mass percentage of the doping ions to the mass of the perovskite precursor material.

From Table 1 and Table 2, it can be seen that the cell prepared from the perovskite precursor after doping has higher photoelectric conversion efficiency.

It should be noted that the present application is not limited to the foregoing implementations. The foregoing implementations are merely examples, and any implementation having substantially the same composition and achieving the same effects as the technical idea within the scope of the technical solutions of the present application is included in the technical scope of the present application. Further, various variations that can be conceived by those skilled in the art and that may be made to the implementations without departing from the spirit of the present application, and other implementations formed by combining some of the constituent elements in the implementations are also included in the scope of the present application.

What is claimed is:

1. A perovskite precursor material, comprising a precursor substrate and doping ions, wherein the precursor substrate comprises a material having a chemical formula MX, M comprises at least one of organic amine cations, cesium ions, lithium ions, potassium ions, rubidium ions, lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, and X comprises at least one of halogen ions and carboxylate ions, wherein the doping ions comprise at least one of alkali metal ions, alkaline earth metal ions, transition metal ions, group IIIA element ions, acid radical ions, and halogen ions, wherein a mass percentage of the doping ions is 0.0001% to 3% based on a mass of the perovskite precursor material, wherein the precursor substrate and the doping ions satisfy at least one of the following:

the precursor substrate comprises at least one selected from formamidinium iodide, iodomethylamine, and chloromethylamine, and the doping ions comprise $PO_2^{3-}$;

the precursor substrate comprises cesium chloride, and the doping ions comprise $Ca^{2+}$;

the precursor substrate comprises cesium iodide, and the doping ions comprise $Fe^{3+}$; and the precursor substrate comprises at least one selected from $PbI_2$ and $PbBr_2$, and the doping ions comprise $Fe^{2+}$.

2. The perovskite precursor material according to claim 1, wherein the mass percentage of the doping ions is 0.0001% to 1%, based on the mass of the perovskite precursor material.

3. The perovskite precursor material according to claim 1, wherein the doping ions comprise at least one of the following features:

(1) the alkali metal ions comprise at least one of $Na^+$ and $K^+$, (2) the alkaline earth metal ions comprise at least one of $Mg^{2+}$ and $Ca^{2+}$, (3) the transition metal ions comprise at least one of $Fe^{2+}$, $Fe^{3+}$, and $Cu^{2+}$, (4) the group IIIA element ions comprise at least one of $B^{3+}$, $Al^{3+}$, $Ga^{3+}$, and $In^{3+}$, (5) the acid radical ions comprise at least one of $Ac^-$, $PO_2^{3-}$, $CO_3^{2-}$, and $NO_3^-$, and (6) the halogen ions comprise at least one of $F^-$, $Cl^-$, $Br^-$, $I^-$, and $I_3^-$.

4. A preparation method for a perovskite precursor material, comprising:

mixing and reacting, in a first solvent, a raw material for providing doping ions and a raw material for synthesizing a precursor substrate, and subjecting a reacted solution to first crystallization treatment, wherein the precursor substrate comprises a material having a chemical formula MX, M comprises at least one of organic amine cations, cesium ions, lithium ions, potassium ions, rubidium ions, lead ions, tin ions, zinc ions, titanium ions, antimony ions, bismuth ions, nickel ions, iron ions, cobalt ions, silver ions, copper ions, gallium ions, germanium ions, magnesium ions, calcium ions, indium ions, aluminum ions, manganese ions, chromium ions, molybdenum ions, and europium ions, and X comprises at least one of halogen ions and carboxylate ions, wherein the doping ions comprise at least one of alkali metal ions, alkaline earth metal ions, transition metal ions, group IIIA element ions, acid radical ions, and halogen ions, wherein a mass percentage of the doping ions is 0.0001% to 3% based on a mass of the perovskite precursor material, wherein the precursor substrate and the doping ions satisfy at least one of the following combinations:

the precursor substrate comprises at least one selected from formamidinium iodide, iodomethylamine, and chloromethylamine, and the doping ions comprise $PO_2^{3-}$;

the precursor substrate comprises cesium chloride, and the doping ions comprise $Ca^{2+}$;

the precursor substrate comprises cesium iodide, and the doping ions comprise $Fe^{3+}$; and the precursor substrate comprises at least one selected from $PbI_2$ and $PbBr_2$, and the doping ions comprise $Fe^{2+}$.

5. The preparation method for a perovskite precursor material according to claim 4, wherein the mass percentage of the doping ions is 0.0001% to 1%, based on the mass of the perovskite precursor material.

6. The preparation method for a perovskite precursor according to claim 4, wherein in the chemical formula MX, M is selected from at least one of organic amine cations and cesium ions, X comprises at least one of halogen ions and carboxylate ions, and the reaction temperature for mixing and reacting, in the first solvent, the raw material for providing the doping ions and the raw material for synthesizing the precursor substrate is 0° C. to 5° C.

7. The preparation method for a perovskite precursor material according to claim 4, wherein the reaction temperature for mixing and reacting, in the first solvent, the raw material for providing the doping ions and the raw material for synthesizing the precursor substrate is 70° C. to 90° C.

8. A perovskite precursor slurry, comprising a second solvent and further comprising the perovskite precursor material according to claim 1, wherein the second solvent comprises N-methyl-2-pyrrolidone (NMP).

9. A perovskite precursor slurry, comprising a second solvent and further comprising the perovskite precursor material obtained by using the preparation method according to claim 4, wherein the second solvent comprises N-methyl-2-pyrrolidone (NMP).

10. A perovskite solar cell, comprising a first electrode, a perovskite layer, and a second electrode that are sequentially stacked, wherein the perovskite layer comprises the perovskite material according to claim 1.

* * * * *